(12) United States Patent
Rajamohanan et al.

(10) Patent No.: US 9,805,793 B2
(45) Date of Patent: Oct. 31, 2017

(54) FILAMENT CONFINEMENT IN REVERSIBLE RESISTANCE-SWITCHING MEMORY ELEMENTS

(71) Applicant: SanDisk Technologies Inc., Plano, TX (US)

(72) Inventors: Bijesh Rajamohanan, Milpitas, CA (US); Juan Saenz, Menlo Park, CA (US); Alvaro Padilla, San Jose, CA (US); Mohsen Purahmad, Sunnyvale, CA (US); Ashot Melik-Martirosian, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/088,902

(22) Filed: Apr. 1, 2016

(65) Prior Publication Data

US 2017/0287557 A1    Oct. 5, 2017

(51) Int. Cl.
*G11C 13/00* (2006.01)

(52) U.S. Cl.
CPC ...... *G11C 13/0069* (2013.01); *G11C 13/0004* (2013.01); *G11C 13/0007* (2013.01); *G11C 2013/0083* (2013.01)

(58) Field of Classification Search
CPC ............ G11C 13/0069; G11C 13/0004; G11C 13/0007
See application file for complete search history.

(56) References Cited

U.S. PATENT DOCUMENTS

| | | | | |
|---|---|---|---|---|
| 8,144,500 B2 * | 3/2012 | Kono | ........................ | G11C 8/08 365/148 |
| 8,830,740 B2 * | 9/2014 | Sasago | ............... | G11C 13/0004 257/2 |
| 9,240,222 B2 * | 1/2016 | Toriyama | ................. | G11C 5/06 |
| 2015/0206580 A1 * | 7/2015 | Toriyama | ........... | G11C 13/0007 365/148 |
| 2016/0300885 A1 * | 10/2016 | Konevecki | .......... | H01L 27/2454 |

OTHER PUBLICATIONS

Hayakawa et al., "Highly reliable TaOx ReRAM with centralized filament for 28-nm embedded application", 2015 Symposium on VLSI Technology Digest of Technical Papers, Jun. 16-18, 2015, 2 pages.

(Continued)

*Primary Examiner* — Huan Hoang
*Assistant Examiner* — Roberto Mancera
(74) *Attorney, Agent, or Firm* — Vierra Magen Marcus LLP

(57) ABSTRACT

A method is provided that includes providing a memory device including a first word line, a vertical bit line, a non-volatile memory material disposed between the first word line and the vertical bit line, and a memory cell disposed between the first word line and the vertical bit line. The first word line has a first height. The method further includes forming one or more conductive filaments in the memory cell. The one or more conductive filaments are substantially confined to a filament region having a second height less than the first height and disposed substantially about a vertical center of the memory cell.

8 Claims, 15 Drawing Sheets

| Conductor | Voltage | Example Value |
|---|---|---|
| WL_T | V1 | +2V |
| WL_D1 | V2 | -3V |
| WL_D2 | V2 | -3V |
| BL | V3 | 0V |

(56) References Cited

OTHER PUBLICATIONS

Lee et al., "Enhancement of resistive switching under confined current path distribution enabled by insertion of atomically thin defective monolayer graphene", Scientific Report, Jul. 10, 2015, 8 pages.

Lee et al., "Fabrication and Characterization of Nanoscale NiO Resistance Change Memory (RRAM) Cells With Confined Conduction Paths", IEEE Transactions of Electron Devices, vol. 58, No. 10, Oct. 2011, 6 pages.

* cited by examiner

FILAMENT CONFINEMENT IN REVERSIBLE RESISTANCE-SWITCHING MEMORY ELEMENTS

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a power source.

One example of non-volatile memory uses memory cells that include reversible resistance-switching memory elements that may be set to either a low resistance state or a high resistance state. The memory cells may be individually connected between first and second conductors (e.g., a bit line electrode and a word line electrode). The state of such a memory cell is typically changed by proper voltages being placed on the first and second conductors.

Some reversible resistance-switching memory elements may be in the high resistance state when first fabricated. The term "FORMING" is used to describe putting the reversible resistance-switching memory elements into a lower resistance state for the first time after fabrication. After a FORMING operation is performed, the reversible resistance-switching memory elements may be reversibly switched between a high resistance state and a low resistance state.

One theory that is used to explain the FORMING mechanism, as well as the reversible resistance-switching mechanism is that one or more conductive filaments are formed by the application of a voltage to the reversible resistance-switching memory elements. One example of a reversible resistance-switching memory element includes a metal oxide as the reversible resistance-switching memory material disposed between the first and second conductors.

In response to a suitable voltage between the first and second conductors, one or more conductive filaments form in the metal oxide, resulting in one or more conductive paths between the first and second conductors of the reversible resistance-switching memory element. The conductive filaments lower the resistance of the reversible resistance-switching memory element. Application of another voltage between the first and second conductors ruptures the conductive filaments, thereby increasing the resistance of the reversible resistance-switching memory element. Application of still another voltage between the first and second conductors repairs the rupture in the conductive filaments, once again decreasing the resistance of the reversible resistance-switching memory element.

The initial formation of the conductive filaments may be referred to as "FORMING." The rupture of the filaments may be referred to as RESETTING, which puts the reversible resistance-switching memory element in a high resistance (RESET) state. The repair of the rupture of the filaments may be referred to as SETTING, which puts the reversible resistance-switching memory element in a low resistance (SET) state. After completing the FORMING process, the reversible resistance-switching memory element may be repeatedly switched between the SET and RESET states by repeatedly RESETTING and SETTING the reversible resistance-switching memory element. Data values may then be assigned to the high resistance RESET state and the low resistance SET state.

The FORMING process may impact the ability of the reversible resistance-switching memory element to exhibit proper switching behavior over time. For example, the reversible resistance-switching memory element may switch consistently between the high resistance state and the low resistance state in response to appropriate voltages, which may be referred to as "switching within the intended window."

DETAILED DESCRIPTION

Figure 1A:
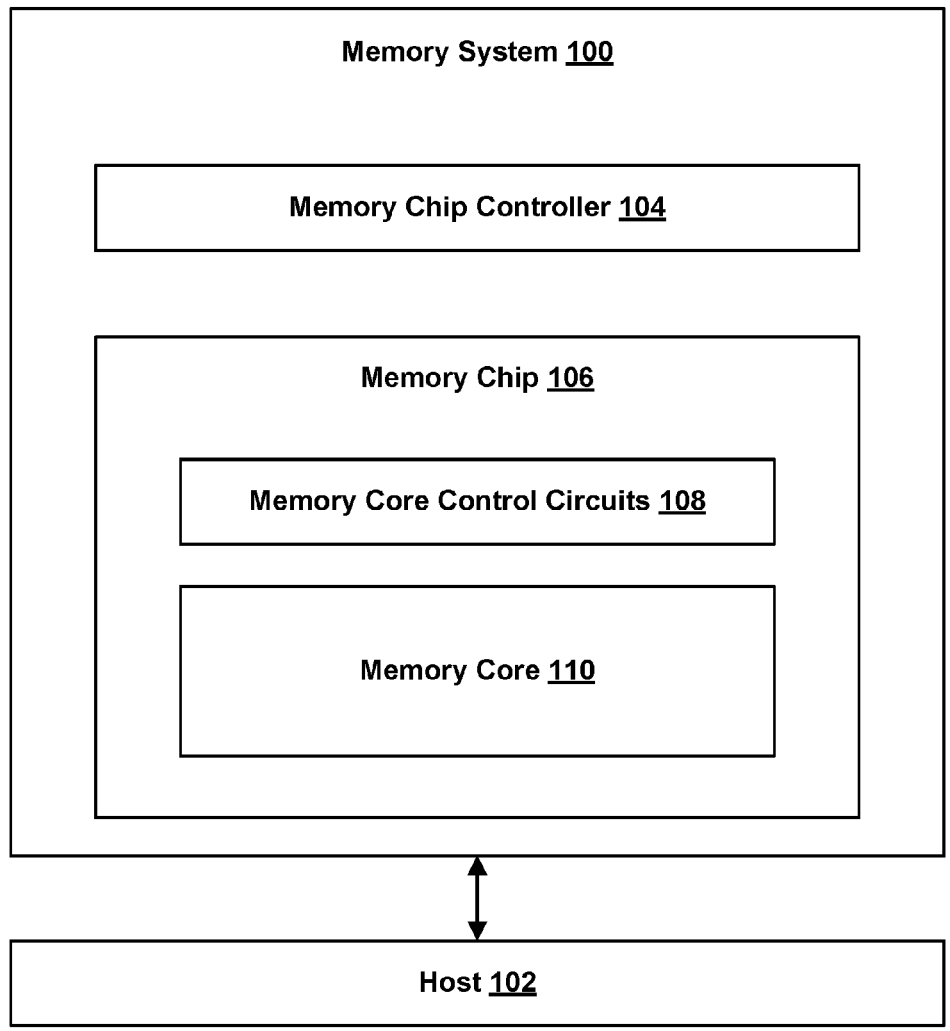
FIG. 1A depicts an embodiment of a memory system and a host.

Technology is described for forming one or more conductive filaments in a non-volatile memory cell, such as a reversible resistance-switching memory cell. The memory cell is disposed between a word line and a vertical bit line. The one or more conductive filaments are substantially confined to a filament region in the memory cell having a height less than a height of the word line and disposed substantially about a vertical center of the memory cell.

In some embodiments, a memory array may include a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a reversible resistance-switching memory element, such as a phase change material, a ferroelectric material, or a metal oxide (e.g., hafnium oxide), disposed between first and second conductors. In some cases, each memory cell in a cross-point memory array includes a reversible resistance-switching memory element in series with a steering element or an isolation element, such as a diode, to reduce leakage currents. In other cross-point memory arrays, the memory cells do not include an isolation element.

In an embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates.

In some cases, a three-dimensional memory array may include one or more vertical columns of memory cells located above and orthogonal to a substrate. In an example, a non-volatile storage system may include a memory array with vertical bit lines or bit lines that are arranged orthogonal to a semiconductor substrate. The substrate may include a silicon substrate. The memory array may include rewriteable non-volatile memory cells, wherein each memory cell includes a reversible resistance-switching memory element without an isolation element in series with the reversible resistance-switching memory element (e.g., no diode in series with the reversible resistance-switching memory element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, and/or control circuitry for controlling reading, programming and erasing of the memory cells). The circuitry associated with the operation of the memory cells may be located above the substrate or within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, and reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of memory cells or one or more three-dimensional arrays of memory cells. In an embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 will send to memory chip controller 104 both a write command and the data to be written. The data to be written may be buffered by memory chip controller 104 and error correcting code (ECC) data may be generated corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 controls operation of memory chip 106. In one example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested. Once a read or write operation is initiated by memory chip controller 104, memory core control circuits 108 may generate the appropriate bias voltages for word lines and bit lines within memory core 110, and generate the appropriate memory block, row, and column addresses.

In some embodiments, one or more managing or control circuits may be used for controlling the operation of a memory array. The one or more managing or control circuits may provide control signals to a memory array to perform an erase operation, a read operation, and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
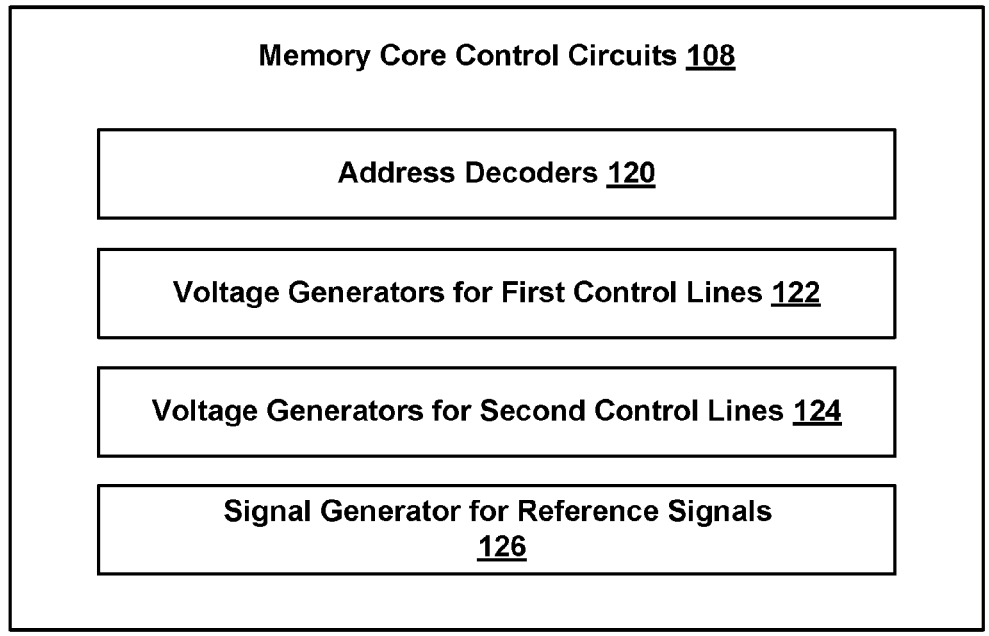
FIG. 1B depicts an embodiment of memory core control circuits.

FIG. 1B depicts one embodiment of memory core control circuits 108. As depicted, memory core control circuits 108 include address decoders 120, voltage generators for first control lines 122, voltage generators for second control lines 124 and signal generators for reference signals 126 (described in more detail below). Control lines may include word lines, bit lines, or a combination of word lines and bit lines. First control lines may include first (e.g., selected) word lines and/or first (e.g., selected) bit lines that are used to place memory cells into a first (e.g., selected) state. Second control lines may include second (e.g., unselected) word lines and/or second (e.g., unselected) bit lines that are used to place memory cells into a second (e.g., unselected) state.

Address decoders 120 may generate memory block addresses, as well as row addresses and column addresses for a particular memory block. Voltage generators (or voltage regulators) for first control lines 122 may include one or more voltage generators for generating first (e.g., selected) control line voltages. Voltage generators for second control lines 124 may include one or more voltage generators for generating second (e.g., unselected) control line voltages. Signal generators for reference signals 126 may include one or more voltage and/or current generators for generating reference voltage and/or current signals.

FIGS. 1C-1F depict one embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
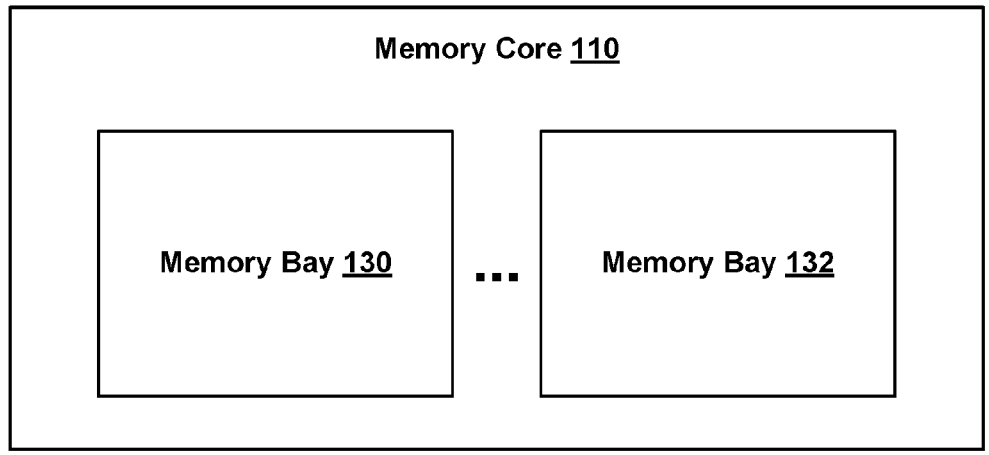
FIG. 1C depicts an embodiment of a memory core.

FIG. 1C depicts an embodiment of memory core 110 of FIG. 1A. As depicted, memory core 110 includes memory bay 130 and memory bay 132. In some embodiments, the number of memory bays per memory core can differ for different implementations. For example, a memory core may include only a single memory bay or multiple memory bays (e.g., 16 or other number of memory bays).

Figure 1D:
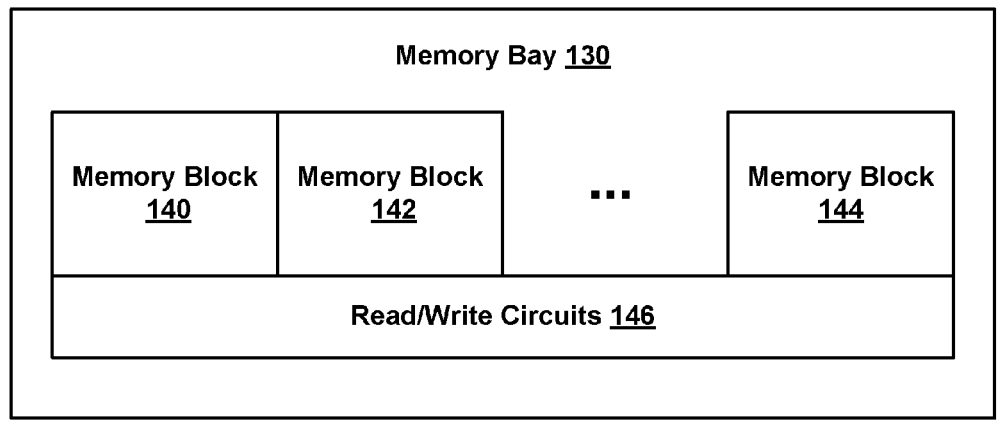
FIG. 1D depicts an embodiment of a memory bay.

FIG. 1D depicts an embodiment of memory bay 130 in FIG. 1C. As depicted, memory bay 130 includes memory blocks 140-144 and read/write circuits 146. In some embodiments, the number of memory blocks per memory bay may differ for different implementations. For example, a memory bay may include one or more memory blocks (e.g., 32 or other number of memory blocks per memory bay). Read/write circuits 146 include circuitry for reading and writing memory cells within memory blocks 140-144.

As depicted, read/write circuits 146 may be shared across multiple memory blocks within a memory bay. This allows chip area to be reduced because a single group of read/write circuits 146 may be used to support multiple memory blocks. However, in some embodiments, only a single memory block may be electrically coupled to read/write circuits 146 at a particular time to avoid signal conflicts.

In some embodiments, read/write circuits 146 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In one example, memory system 100 of FIG. 1A may receive a write command including a target address and a set of data to be written to the target address. Memory system 100 may perform a read-before-write (RBW) operation to read the data currently stored at the target address and/or to acquire overhead information (e.g., ECC information) before performing a write operation to write the set of data to the target address.

In some cases, read/write circuits 146 may be used to program a particular memory cell to be in one of three or more data/resistance states (i.e., the particular memory cell may include a multi-level memory cell). In one example, read/write circuits 146 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states.

Applying a smaller voltage difference across the particular memory cell may cause the particular memory cell to be partially programmed or programmed at a slower rate than when applying a larger voltage difference. In another example, read/write circuits 146 may apply a first voltage difference across the particular memory cell for a first time period to program the particular memory cell into a first state of the three or more data/resistance states, and apply the first voltage difference across the particular memory cell for a second time period less than the first time period. One or more programming pulses followed by a memory cell verification phase may be used to program the particular memory cell to be in the correct state.

Figure 1E:
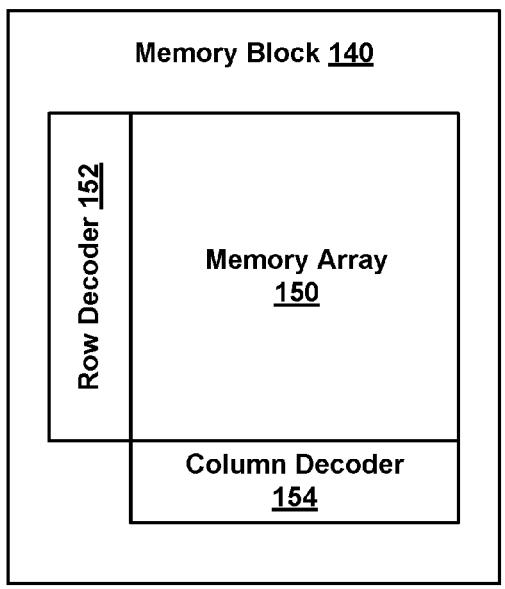
FIG. 1E depicts an embodiment of a memory block.

FIG. 1E depicts an embodiment of memory block 140 in FIG. 1D. As depicted, memory block 140 includes a memory array 150, row decoder 152, and column decoder 154. Memory array 150 may include a contiguous group of memory cells having contiguous word lines and bit lines. Memory array 150 may include one or more layers of memory cells. Memory array 150 may include a two-dimensional memory array or a three-dimensional memory array.

Row decoder 152 decodes a row address and selects a particular word line in memory array 150 when appropriate (e.g., when reading or writing memory cells in memory array 150). Column decoder 154 decodes a column address and selects one or more bit lines in memory array 150 to be electrically coupled to read/write circuits, such as read/write circuits 146 in FIG. 1D. In one embodiment, the number of word lines is 4K per memory layer, the number of bit lines is 1K per memory layer, and the number of memory layers is 4, providing a memory array 150 containing 16M memory cells.

Figure 1F:
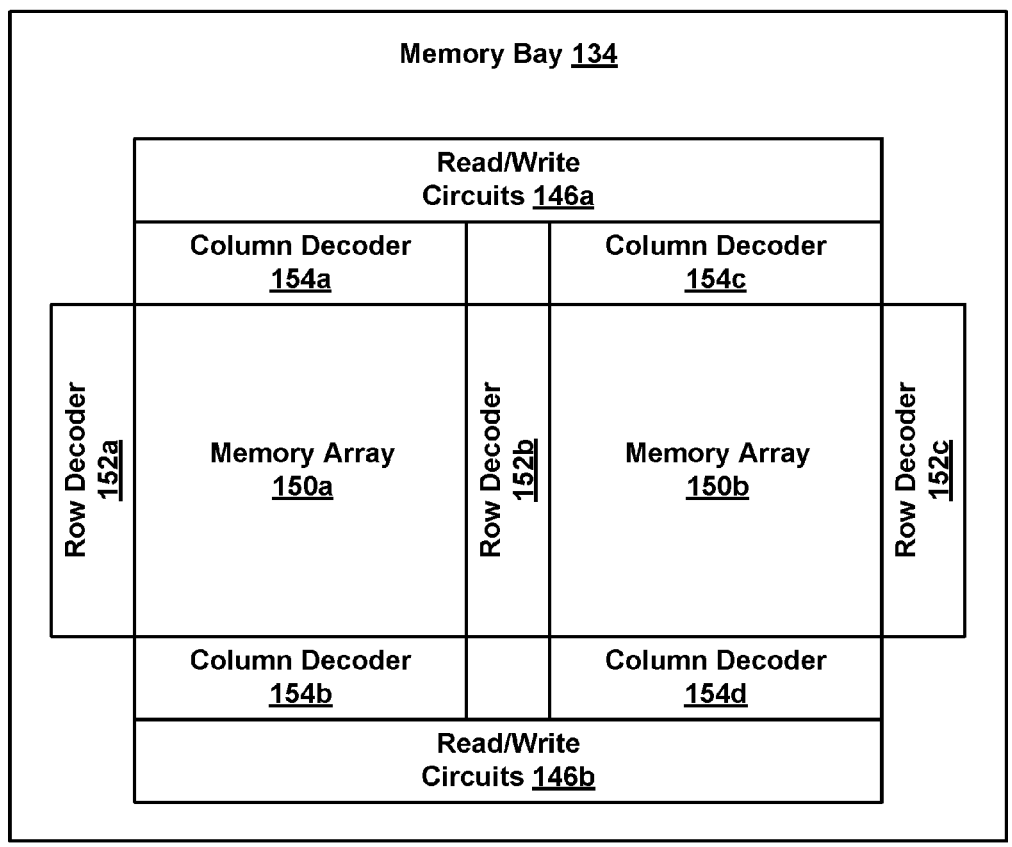
FIG. 1F depicts another embodiment of a memory bay.

FIG. 1F depicts an embodiment of a memory bay 134. Memory bay 134 is an alternative example implementation for memory bay 130 of FIG. 1D. In some embodiments, row decoders, column decoders, and read/write circuits may be split or shared between memory arrays. As depicted, row decoder 152b is shared between memory arrays 150a and 150b because row decoder 152b controls word lines in both memory arrays 150a and 150b (i.e., the word lines driven by row decoder 152b are shared).

Row decoders 152a and 152b may be split such that even word lines in memory array 150a are driven by row decoder 152a and odd word lines in memory array 150a are driven by row decoder 152b. Row decoders 152c and 152b may be split such that even word lines in memory array 150b are driven by row decoder 152c and odd word lines in memory array 150b are driven by row decoder 152b.

Column decoders 154a and 154b may be split such that even bit lines in memory array 150a are controlled by column decoder 154b and odd bit lines in memory array 150a are driven by column decoder 154a. Column decoders 154c and 154d may be split such that even bit lines in memory array 150b are controlled by column decoder 154d and odd bit lines in memory array 150b are driven by column decoder 154c.

The selected bit lines controlled by column decoder 154a and column decoder 154c may be electrically coupled to read/write circuits 146a. The selected bit lines controlled by column decoder 154b and column decoder 154d may be electrically coupled to read/write circuits 146b. Splitting the read/write circuits into read/write circuits 146a and 146b when the column decoders are split may allow for a more efficient layout of the memory bay.

Figure 2A:
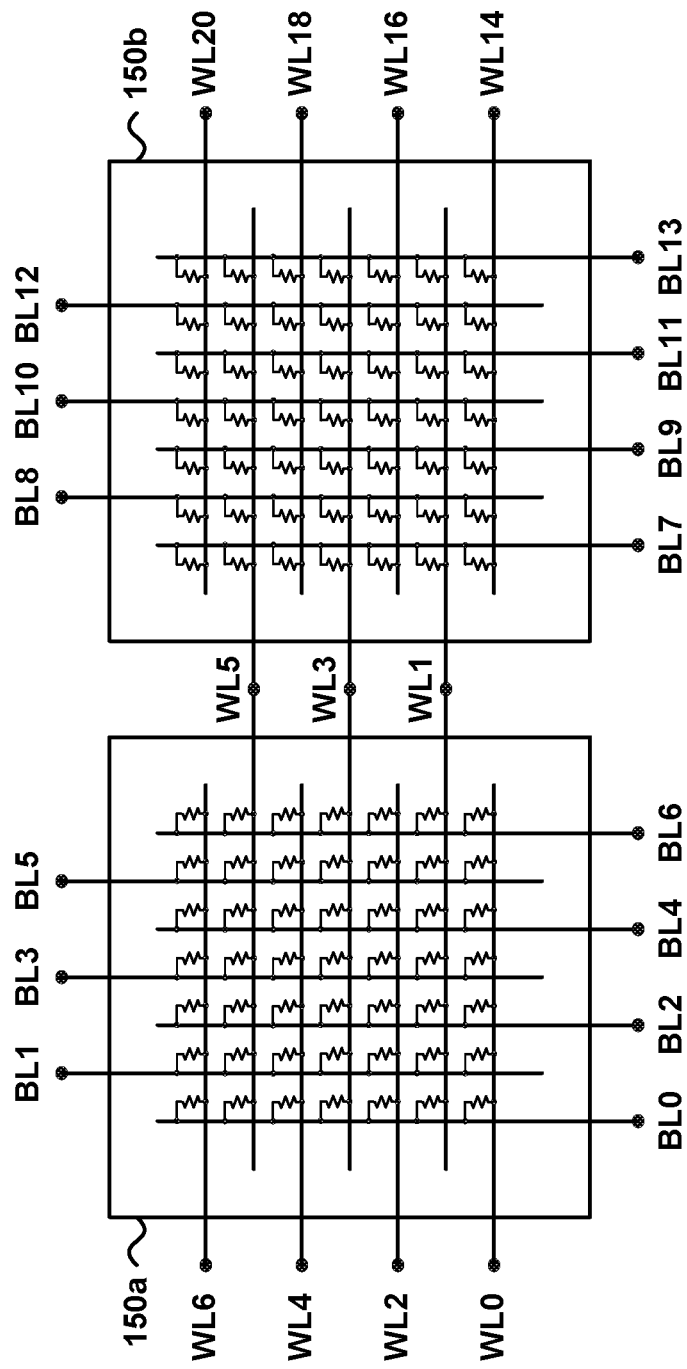
FIG. 2A depicts a schematic diagram of the memory bay of FIG. 1F.

FIG. 2A depicts an embodiment of a schematic diagram (including word lines and bit lines) corresponding with memory bay 134 of FIG. 1F. As depicted, word lines WL1, WL3, and WL5 are shared between memory arrays 150a and 150b and controlled by row decoder 152b of FIG. 1F. Word lines WL0, WL2, WL4, and WL6 are driven from the left side of memory array 150a and controlled by row decoder 152a of FIG. 1F. Word lines WL14, WL16, WL18, and WL20 are driven from the right side of memory array 150b and controlled by row decoder 152c of FIG. 1F.

Bit lines BL0, BL2, BL4, and BL6 are driven from the bottom of memory array 150a and controlled by column decoder 154b of FIG. 1F. Bit lines BL1, BL3, and BL5 are driven from the top of memory array 150a and controlled by column decoder 154a of FIG. 1F. Bit lines BL7, BL9, BL11, and BL13 are driven from the bottom of memory array 150b and controlled by column decoder 154d of FIG. 1F. Bit lines BL8, BL10, and BL12 are driven from the top of memory array 150b and controlled by column decoder 154c of FIG. 1F.

In an embodiment, memory arrays 150a and 150b may include memory layers that are oriented in a plane that is horizontal to the supporting substrate. In another embodiment, memory arrays 150a and 150b may include memory layers that are oriented in a plane that is vertical with respect to the supporting substrate (i.e., the vertical plane is substantially perpendicular to the supporting substrate).

Figure 2B:
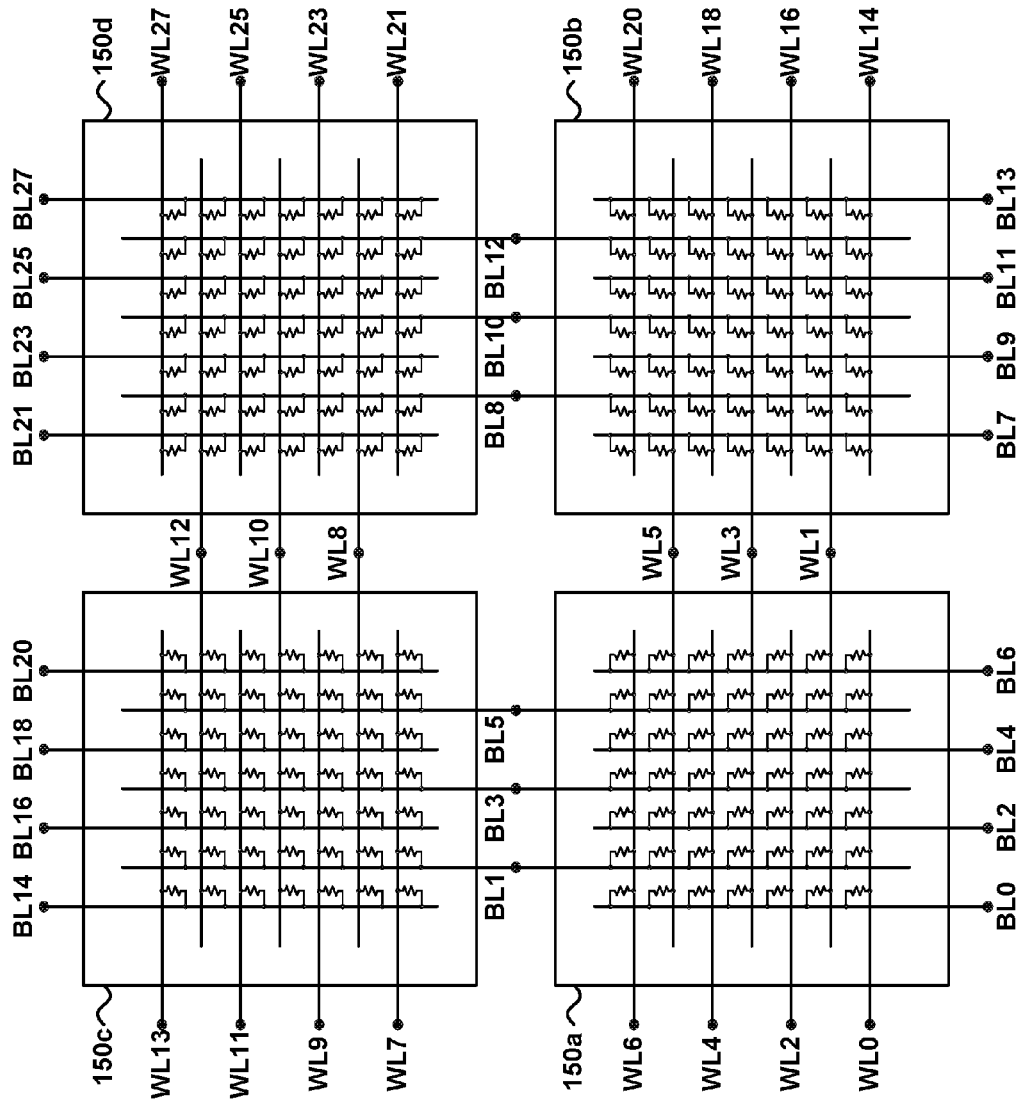
FIG. 2B depicts a schematic diagram of a memory bay arrangement wherein word lines and bit lines are shared across memory blocks, and both row decoders and column decoders are split.

FIG. 2B depicts an embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays.

As depicted, word lines WL1, WL3, and WL5 are shared between memory arrays 150a and 150b, and word lines WL8, WL10 and WL12 are shared between memory arrays 150c and 150d. Bit lines BL1, BL3, and BL5 are shared between memory arrays 150a and 150c, and bit lines BL8, BL10, and BL12 are shared between memory arrays 150b and 150d.

Row decoders are split such that word lines WL0, WL2, WL4, and WL6 are driven from the left side of memory array 150a and word lines WL1, WL3, and WL5 are driven from the right side of memory array 150a. Likewise, word lines WL7, WL9, WL11, and WL13 are driven from the left side of memory array 150c and word lines WL8, WL10, and WL12 are driven from the right side of memory array 150c.

Column decoders are split such that bit lines BL0, BL2, BL4, and BL6 are driven from the bottom of memory array 150a and bit lines BL1, BL3, and BL5 are driven from the top of memory array 150a. Likewise, bit lines BL21, BL23, BL25, and BL27 are driven from the top of memory array 150d and bit lines BL8, BL10, and BL12 are driven from the bottom of memory array 150d. Splitting row and/or column decoders also helps to relieve layout constraints (e.g., the column decoder pitch can be relieved by 2× since the split column decoders need only drive every other bit line instead of every bit line).

Figure 3A:
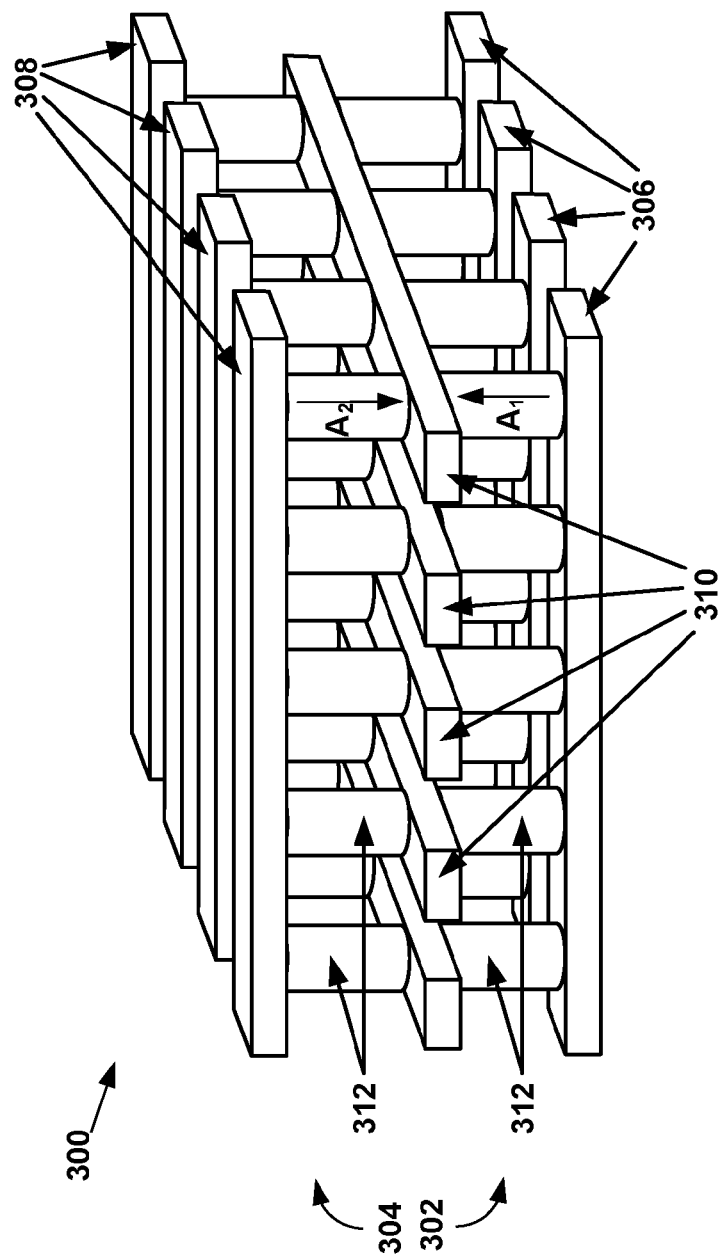
FIG. 3A depicts an embodiment of a portion of a monolithic three-dimensional memory array.

FIG. 3A depicts an embodiment of a portion of a monolithic three-dimensional memory array 300 that includes a first memory level 302 and a second memory level 304 positioned above first memory level 302. Memory array 300 is one example of an implementation for memory array 150 of FIG. 1E. Bit lines 306 and 308 are arranged in a first direction and word lines 310 are arranged in a second direction perpendicular to the first direction. As depicted, the upper conductors of first memory level 302 may be used as the lower conductors of second memory level 304. In a memory array with additional layers of memory cells, there would be corresponding additional layers of bit lines and word lines.

Memory array 300 includes a plurality of memory cells 312. Memory cells 312 may include re-writeable memory cells, and may include non-volatile memory cells or volatile memory cells. With respect to first memory level 302, a first portion of memory cells 312 are between and connect to bit lines 306 and word lines 310. With respect to second memory level 304, a second portion of memory cells 312 are between and connect to bit lines 308 and word lines 310. In an embodiment, each memory cell 312 includes a steering element (e.g., a diode) and a reversible resistance-switching memory element.

In one example, the diodes of first memory level 302 may be upward pointing diodes as indicated by arrow $A_1$ (e.g., with p regions at the bottom of the diodes), whereas the diodes of second memory level 304 may be downward pointing diodes as indicated by arrow $A_2$ (e.g., with n regions at the bottom of the diodes), or vice versa. In another embodiment, each memory cell 312 includes only a reversible resistance-switching memory element. The absence of a diode (or other steering element) from a memory cell may reduce the process complexity and costs associated with manufacturing a memory array.

In one embodiment, memory cells 312 include re-writable non-volatile memory cells including a reversible resistance-switching memory element. A reversible resistance-switching memory element may include a reversible resistance-switching memory material having a resistance that may be reversibly switched between two or more states. In an embodiment, the reversible resistance-switching memory material may include a metal oxide (e.g., a binary metal oxide). The metal oxide may include nickel oxide, hafnium oxide, or some other metal oxide material. In another embodiment, the reversible resistance-switching memory material may include a phase change material. The phase change material may include a chalcogenide material. In some embodiments, the re-writeable non-volatile memory cells may include resistive RAM (ReRAM) devices.

In an embodiment of a read operation, data stored in one of the plurality of memory cells 312 may be read by biasing one of the word lines (i.e., the selected word line) to a selected word line voltage in read mode (e.g., 0V). A sense amplifier may then be used to bias a selected bit line connected to the selected memory cell to the selected bit line voltage in read mode (e.g., 1.0V). In some cases, to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V).

In an embodiment of a write operation, the reversible resistance-switching memory material may be in an initial high-resistance state that is switchable to a low-resistance state upon application of a first voltage and/or current. Application of a second voltage and/or current returns the reversible resistance-switching material back to the high-resistance state. Alternatively, the reversible resistance-switching material may be in an initial low-resistance state that is reversibly switchable to a high-resistance state upon application of the appropriate voltage(s) and/or current(s).

When used in a memory cell, one resistance state may represent a binary data "0," and another resistance state may represent a binary data "1." In some cases, a memory cell may be considered to include more than two data/resistance states (i.e., a multi-level memory cell). In some cases, a write operation may be similar to a read operation except with a larger voltage range placed across the selected memory cells.

In one embodiment of a write operation, data may be written to one of the plurality of memory cells 312 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V).

In some cases, to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation to detect a write disturb.

Figure 3B:
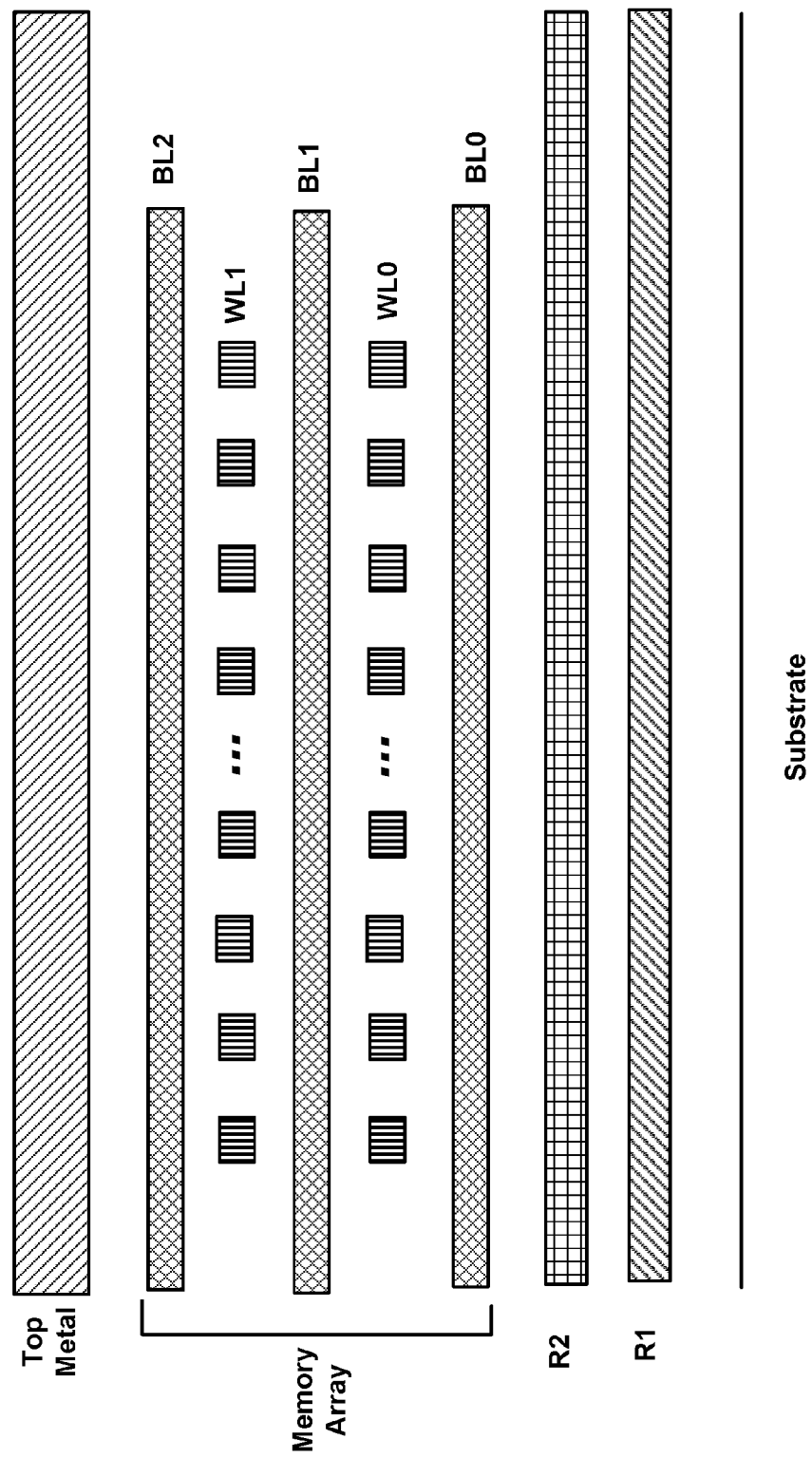
FIG. 3B depicts a subset of the memory array and routing layers of an embodiment of a three-dimensional memory array.

FIG. 3B depicts a subset of the memory array and routing layers of one embodiment of a three-dimensional memory array, such as memory array 150 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers also can be implemented. Supporting circuitry (e.g., row decoders, column decoders, and read/write circuits) may be arranged on the surface of the Substrate with the Memory Array layers fabricated above the supporting circuitry.

An integrated circuit implementing a three-dimensional memory array also may include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3B, two metal layers R1 and R2 are used for routing layers. However, other embodiments can include more or less than two metal layers. In one example, these metal layers R1 and R2 are formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 4A:
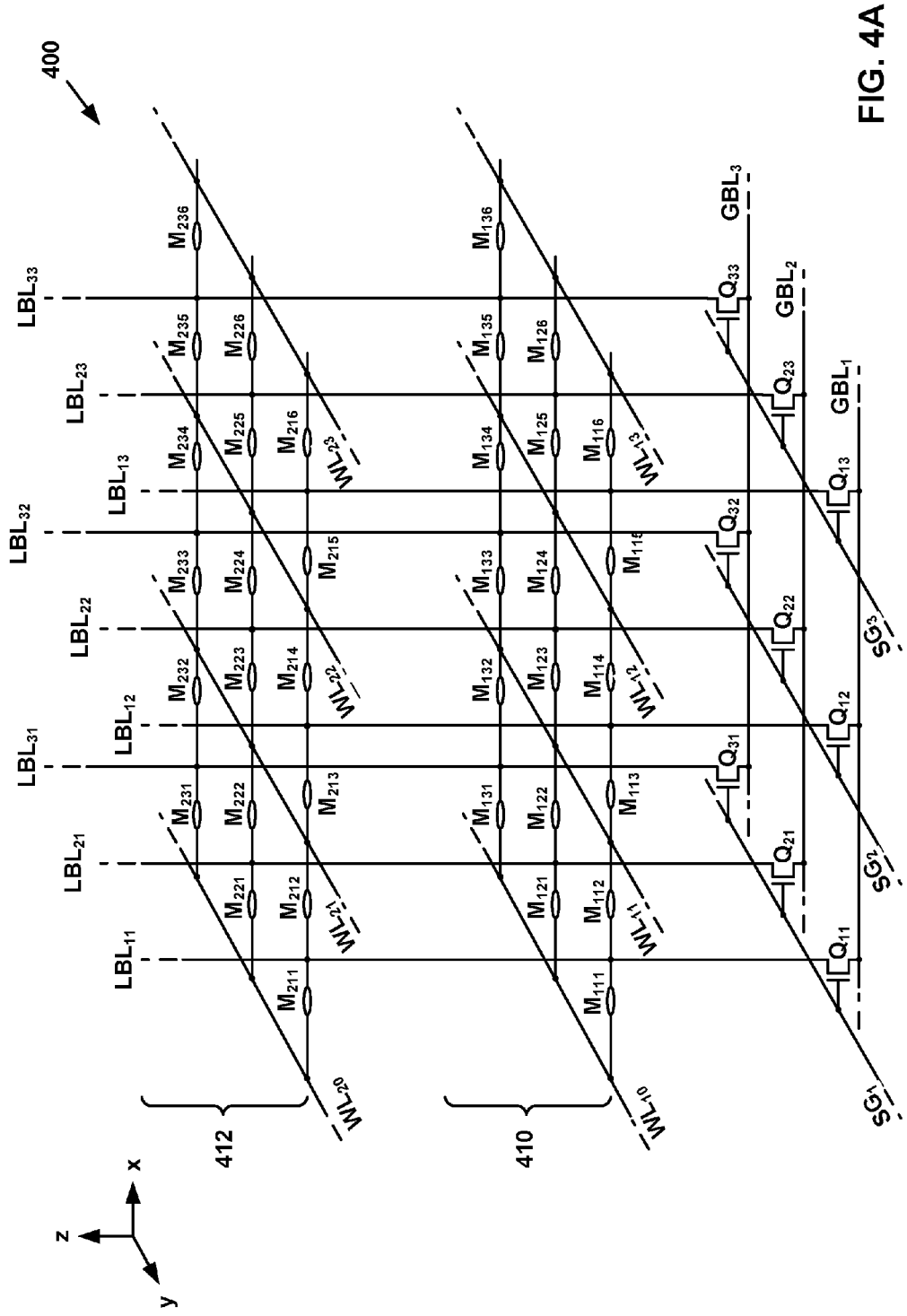
FIG. 4A depicts an embodiment of a portion of a monolithic three-dimensional memory array.

FIG. 4A depicts one embodiment of a portion of a monolithic three-dimensional memory array 400 that includes a first memory level 410, and a second memory level 412 positioned above first memory level 410. Memory array 400 is one example of an implementation for memory array 150 of FIG. 1E. Local bit lines $LBL_{11}$-$LBL_{33}$ are arranged in a first direction (e.g., a z-direction) and word lines $WL_{10}$-$WL_{23}$ are arranged in a second direction (e.g., an x-direction) perpendicular to the first direction. This arrangement of vertical bit lines in a monolithic three-dimensional memory array is one embodiment of a vertical bit line memory array.

As depicted, disposed between the intersection of each local bit line and each word line is a particular memory cell (e.g., memory cell $M_{111}$ is disposed between local bit line $LBL_{11}$ and word line $WL_{10}$). The particular memory cell may include a floating gate memory element, a charge trap memory element (e.g., using a silicon nitride material), a reversible resistance-switching memory element, or other similar device. The global bit lines $GBL_1$-$GBL_3$ are arranged in a third direction (e.g., a y-direction) that is perpendicular to both the first direction and the second direction.

Each local bit line $LBL_{11}$-$LBL_{33}$ has an associated bit line select transistor $Q_{11}$-$Q_{33}$, respectively. Bit line select transistors $Q_{11}$-$Q_{33}$ may be field effect transistors, such as shown, or may be any other transistors. As depicted, bit line select transistors $Q_{11}$-$Q_{31}$ are associated with local bit lines $LBL_{11}$-$LBL_{31}$, respectively, and may be used to connect local bit lines $LBL_{11}$-$LBL_{31}$ to global bit lines $GBL_1$-$GBL_3$, respectively, using row select line $SG_1$. In particular, each of bit line select transistors $Q_{11}$-$Q_{31}$ has a first terminal (e.g., a drain/source terminal) coupled to a corresponding one of local bit lines $LBL_{11}$-$LBL_{31}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_1$.

Similarly, bit line select transistors $Q_{12}$-$Q_{32}$ are associated with local bit lines $LBL_{12}$-$LBL_{32}$, respectively, and may be used to connect local bit lines $LBL_{12}$-$LBL_{32}$ to global bit lines $GBL_1$-$GBL_3$, respectively, using row select line $SG_2$. In particular, each of bit line select transistors $Q_{12}$-$Q_{32}$ has a first terminal (e.g., a drain/source terminal) coupled to a corresponding one of local bit lines $LBL_{12}$-$LBL_{32}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_2$.

Likewise, bit line select transistors $Q_{13}$-$Q_{33}$ are associated with local bit lines $LBL_{13}$-$LBL_{33}$, respectively, and may be used to connect local bit lines $LBL_{13}$-$LBL_{33}$ to global bit lines $GBL_1$-$GBL_3$, respectively, using row select line $SG_3$. In particular, each of bit line select transistors $Q_{13}$-$Q_{33}$ has a first terminal (e.g., a drain/source terminal) coupled to a corresponding one of local bit lines $LBL_{13}$-$LBL_{33}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_3$.

Because a single bit line select transistor is associated with a corresponding local bit line, the voltage of a particular global bit line may be applied to a corresponding local bit line. Therefore, when a first set of local bit lines (e.g., $LBL_{11}$-$LBL_{31}$) is biased to global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated.

In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{33}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 400, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, whereas the number of memory cells along each word line may be 2048 or more than 4096. Other numbers of memory cells along each bit line and along each word line may be used.

In one embodiment of a read operation, the data stored in a selected memory cell (e.g., memory cell $M_{111}$) may be read by biasing the word line connected to the selected memory cell (e.g., selected word line $WL_{10}$) to a selected word line voltage in read mode (e.g., 0V). The local bit line (e.g., $LBL_{11}$) coupled to the selected memory cell ($M_{111}$) is biased to a selected bit line voltage in read mode (e.g., 1 V) via the associated bit line select transistor (e.g., $Q_{11}$) coupled to the selected local bit line ($LBL_{11}$), and the global bit line (e.g., $GBL_1$) coupled to the bit line select transistor ($Q_{11}$). A sense amplifier may then be coupled to the selected local bit line ($LBL_{11}$) to determine a read current $I_{READ}$ of the selected memory cell ($M_{111}$). The read current $I_{READ}$ is conducted by the bit line select transistor $Q_{11}$, and may be between about 100 nA and about 500 nA, although other read currents may be used.

In one embodiment of a write operation, data may be written to a selected memory cell (e.g., memory cell $M_{221}$) by biasing the word line connected to the selected memory cell (e.g., $WL_{20}$) to a selected word line voltage in write mode (e.g., 5V). The local bit line (e.g., $LBL_{21}$) coupled to the selected memory cell ($M_{221}$) is biased to a selected bit line voltage in write mode (e.g., 0 V) via the associated bit line select transistor (e.g., $Q_{21}$) coupled to the selected local bit line ($LBL_{21}$), and the global bit line (e.g., $GBL_2$) coupled to the bit line select transistor ($Q_{21}$). During a write operation, a programming current $I_{PGRM}$ is conducted by the associated bit line select transistor $Q_{21}$, and may be between about 3 uA and about 6 uA, although other programming currents may be used.

Figure 4B:
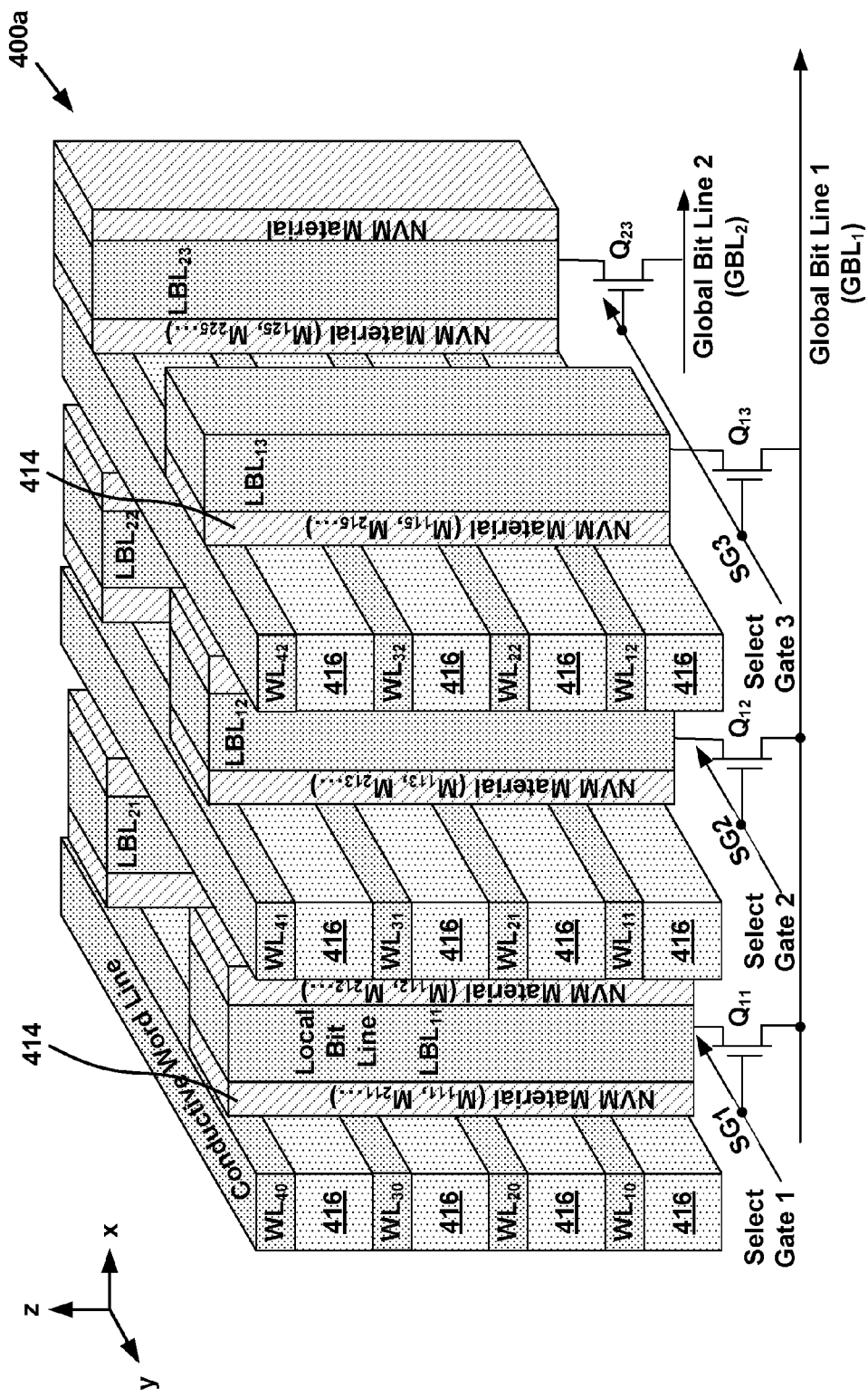
FIG. 4B depicts an embodiment of a portion of a monolithic three-dimensional memory array that includes vertical strips of a non-volatile memory material.

FIG. 4B depicts an embodiment of a portion of a monolithic three-dimensional memory array 400a that includes vertical strips of a non-volatile memory material. The portion of monolithic three-dimensional memory array 400a depicted in FIG. 4B may include one implementation for a portion of the monolithic three-dimensional memory array 400 depicted in FIG. 4A.

Monolithic three-dimensional memory array 400a includes word lines $WL_{10}$, $WL_{11}$, $WL_{12}$, ..., $WL_{42}$ that are formed in a first direction (e.g., an x-direction), vertical local bit lines $LBL_{11}$, $LBL_{12}$, $LBL13$, ..., $LBL_{23}$ that are formed in a second direction perpendicular to the first direction (e.g., a z-direction), and vertical strips of non-volatile memory material 414 formed in the second direction (e.g., the z-direction). A spacer 416 made of a dielectric material (e.g., silicon dioxide, silicon nitride, or other dielectric material) is disposed between adjacent word lines $WL_{10}$, $WL_{11}$, $WL_{12}$, ..., $WL_{42}$.

The vertical strip of the non-volatile memory material 414 may include, for example, a vertical oxide material, a vertical reversible resistance-switching memory material (e.g., a metal oxide layer such as nickel oxide, hafnium oxide, or other similar metal oxide material, a phase change material or other similar reversible resistance-switching memory material), or a vertical charge trapping material (e.g., a layer of silicon nitride). In an embodiment, the vertical strip of material 414 may include a single continuous layer of material that may be used by a plurality of memory cells or devices.

In an embodiment, portions of the vertical strip of the non-volatile memory material 414 may include a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure).

As depicted, each of the vertical bit lines may be connected to one of a set of global bit lines via an associated vertically-oriented bit line select transistor (e.g., $Q_{11}$, $Q_{12}$, $Q_{13}$, $Q_{23}$). Each vertically-oriented bit line select transistor may include a MOS device (e.g., an NMOS device) or a vertical thin-film transistor (TFT).

In an embodiment, each vertically-oriented bit line select transistor is a vertically-oriented pillar-shaped TFT coupled between an associated local bit line pillar and a global bit line. In an embodiment, the vertically-oriented bit line select transistors are formed in a pillar select layer formed above a CMOS substrate, and a memory layer that includes multiple layers of word lines and memory elements is formed above the pillar select layer.

Figure 5A:
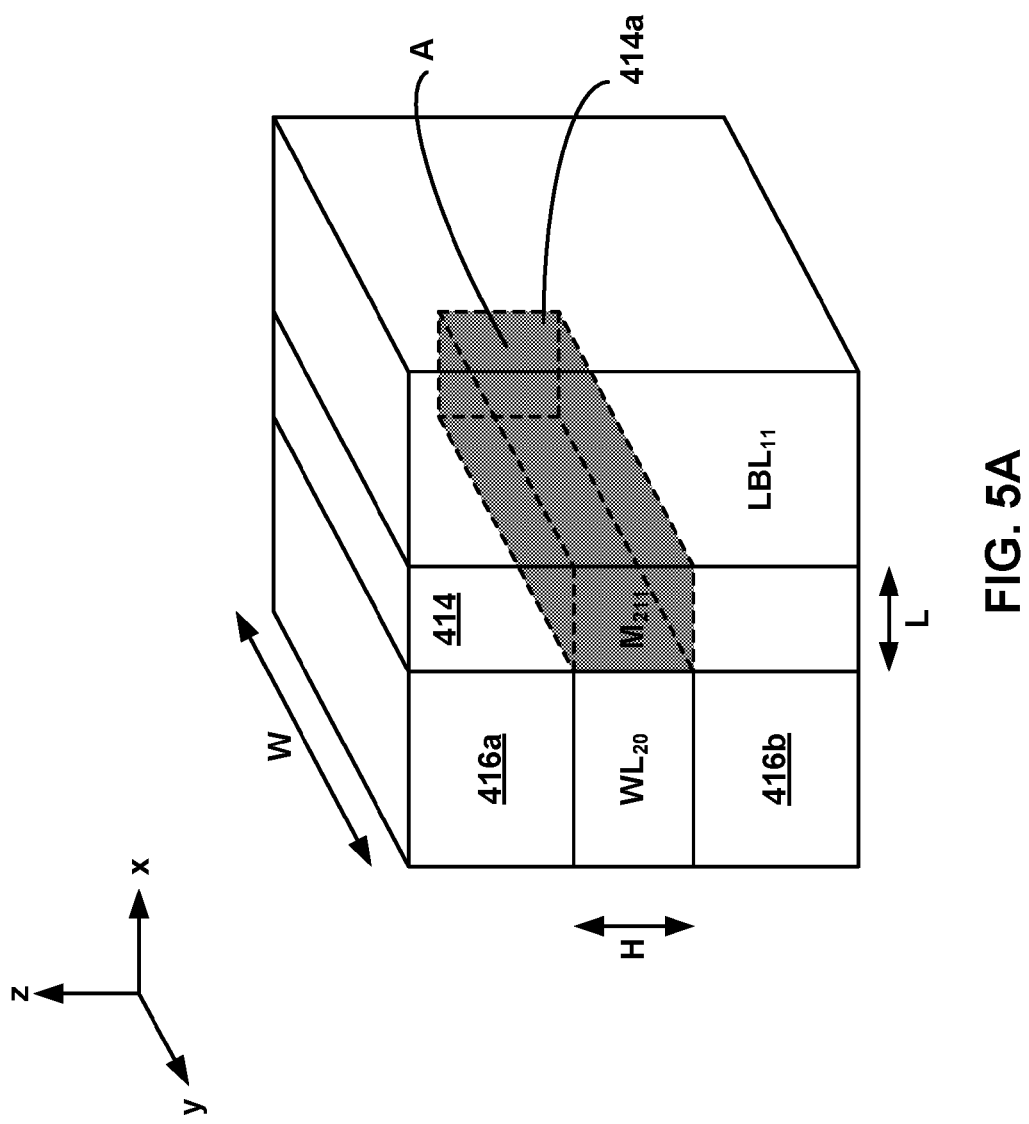
FIG. 5A depicts an enlarged view of a portion of a monolithic three-dimensional memory array of FIG. 4B.

FIG. 5A depicts an enlarged view of a portion of a monolithic three-dimensional memory array 400a of FIG. 4B, in which vertical strip of the non-volatile memory material 414 includes a reversible resistance-switching memory material. For simplicity, vertical strip of the non-volatile memory material 414 will be referred to in the remaining discussion as reversible resistance-switching memory material 414.

In particular, FIG. 5A illustrates a portion of vertical bit line $LBL_{11}$ and reversible resistance-switching memory material 414, a portion of word line $WL_{20}$ that intersects with vertical bit line $LBL_{11}$, a corresponding portion of spacer 416a disposed on a top side of word line $WL_{20}$, a corresponding portion of spacer 416b disposed on a bottom side of word line $WL_{20}$, and memory cell $M_{211}$ disposed between an intersection of vertical bit line $LBL_{11}$ and word line $WL_{20}$.

Word line $WL_{20}$ has a height H, and vertical bit line $LBL_{11}$ has a width W. Memory cell $M_{211}$ has a "working" cell area $A=H \times W$, which is the area encompassed by the intersection of word line $WL_{20}$ and vertical bit line $LBL_{11}$. Reversible resistance-switching memory material 414 has a length L. Memory cell $M_{211}$ includes a portion 414a of reversible resistance-switching memory material 414.

Upon fabrication, memory cell $M_{211}$ may be in a high resistance state. After a FORMING operation is performed, memory cell $M_{211}$ may be reversibly switched between a low resistance state and a high resistance state. In an example FORMING operation, a first voltage Vform (e.g., +2V) is applied to word line $WL_{20}$, a second voltage (e.g., 0V) is applied to vertical bit line $LBL_{11}$ for a predetermined time interval (e.g., 1000000 nsec), or until a current conducted by vertical bit line current $LBL_{11}$ exceeds a predetermined forming current Iform (e.g., 100 nA). One theory that is used to explain the FORMING mechanism, is that in response to the forming voltage Vform applied between word line $WL_{20}$ and vertical bit line $LBL_{11}$, one or more conductive filaments form in reversible resistance-switching memory material portion 414a between word line $WL_{20}$ and vertical bit line $LBL_{11}$.

Figure 5C:
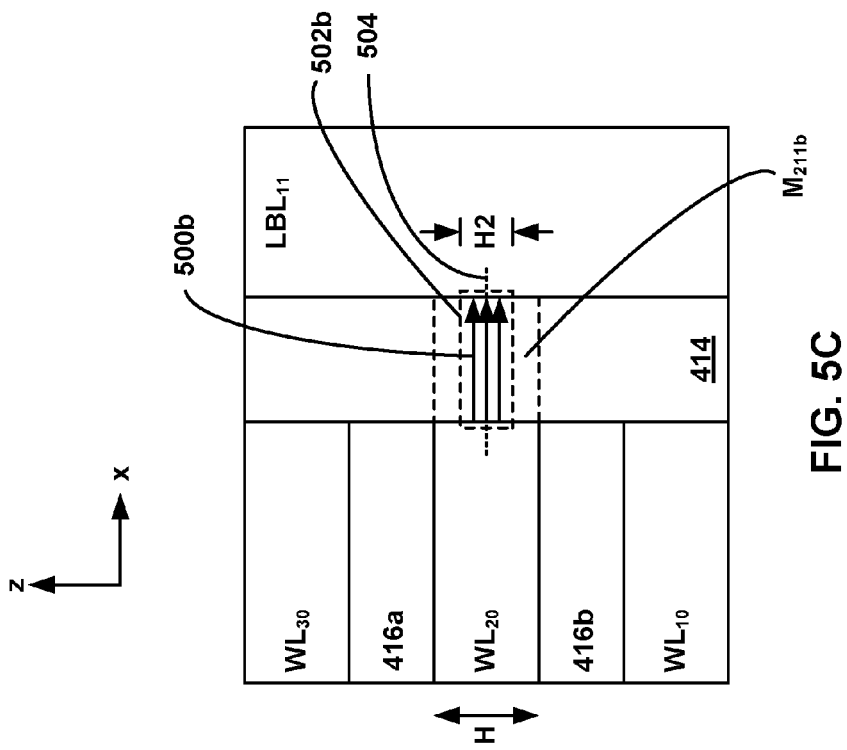
FIGS. 5B and 5C depict embodiments of memory cells that include conductive filaments.
Figure 5B:
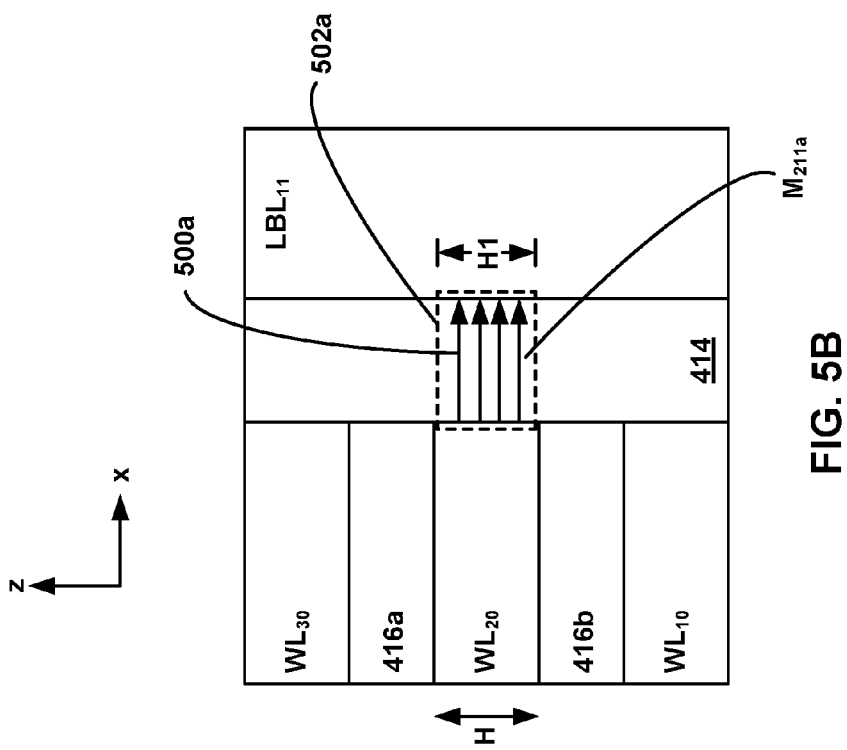

FIGS. 5B and 5C depict embodiments of memory cells that include conductive filaments that form in different regions of reversible resistance-switching memory material in the memory cells. In particular, FIG. 5B depicts a side view of word lines $WL_{10}$, $WL_{20}$ and $WL_{30}$, a portion of vertical bit line $LBL_{11}$, and a portion of reversible resistance-switching memory material 414 disposed between word lines $WL_{10}$, $WL_{20}$ and $WL_{30}$ and vertical bit line $LBL_{11}$. In the illustrated embodiment, memory cell $M_{211a}$ includes one or more conductive filaments 500a that may form anywhere in an unconfined filament formation region 502a that has a height H1 substantially equal to the height H of word line $WL_{20}$.

FIG. 5C also depicts a side view of word lines $WL_{10}$, $WL_{20}$ and $WL_{30}$, a portion of vertical bit line $LBL_{11}$, and a portion of reversible resistance-switching memory material 414 disposed between word lines $WL_{10}$, $WL_{20}$ and $WL_{30}$ and vertical bit line $LBL_{11}$. In the illustrated embodiment, however, memory cell $M_{211b}$ includes one or more conductive filaments 500b that may form substantially solely in a confined filament formation region 502b that has a height H2 less than the height H of word line $WL_{20}$. Confined filament formation region 502b of FIG. 5C is smaller than unconfined filament formation region 502a of FIG. 5B. In addition, conductive filaments 500b of memory cell $M_{211b}$ are disposed substantially in a narrower region about a center axis 504 of word line $WL_{20}$ and memory cell $M_{211b}$.

Without wanting to be bound by any particular theory, it is believed that many benefits may accrue as a result of filament confinement, such as that illustrated in FIG. 5C, in reversible resistance-switching memory cells. For example, filament confinement may reduce variability of programming voltages and state resistances, improve endurance and improve data retention properties of reversible resistance-switching memory cells compared to reversible resistance-switching memory cells that do not include filament confinement.

One technique to achieve filament confinement is to reduce the height H of word lines (e.g., word lines $WL_{10}$, $WL_{20}$, $WL_{30}$, . . . ) of a memory array. Although such a physical reduction in height would indeed result in filament confinement, the word line resistance also would undesirably increase. Technology is described to achieve filament confinement electrically in reversible resistance-switching memory cells without physically reducing the size of word lines in the memory array.

Figure 6:
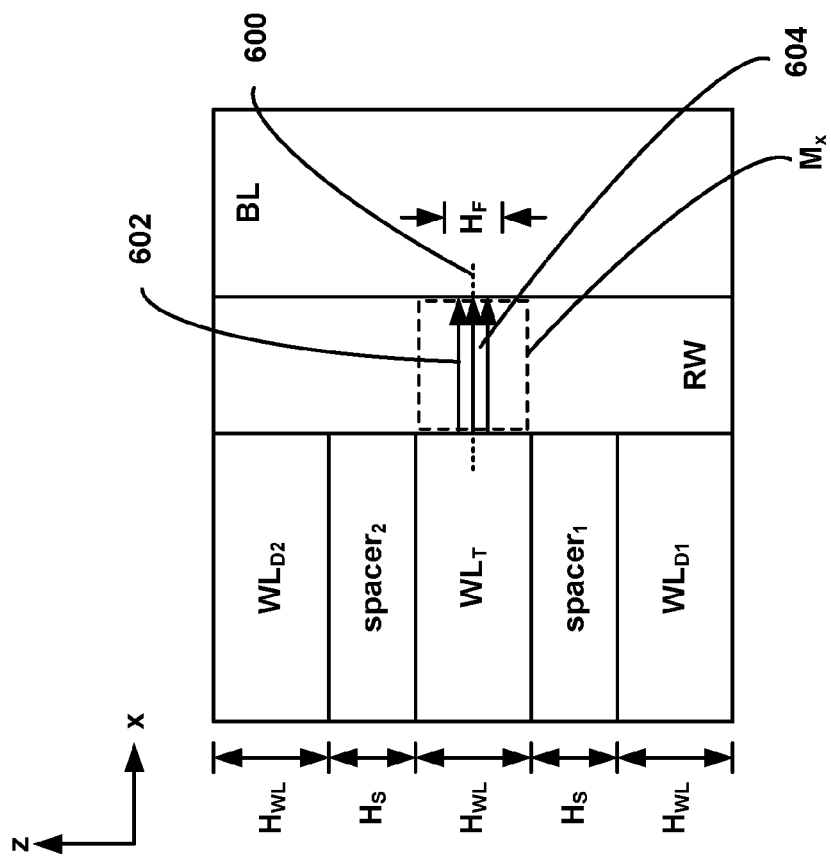
FIG. 6 depicts a side view of a memory structure.

In particular, FIG. 6 depicts a side view of a memory structure that includes dummy word lines $WL_{D1}$ and $WL_{D2}$, a target word line $WL_T$, a first dielectric spacer $spacer_1$ disposed between dummy word line $WL_{D1}$ and target word line $WL_T$, a second dielectric spacer $spacer_2$ disposed between target word line $WL_T$ and dummy word line $WL_{D2}$, a vertical bit line BL, a reversible resistance-switching memory material RW disposed between word lines $WL_T$, $WL_{D1}$ and $WL_{D2}$ and vertical bit line BL, and memory cell $M_X$ disposed between target word line $WL_T$ and vertical bit line BL.

Word lines $WL_T$, $WL_{D1}$ and $WL_{D2}$ each have a height $H_{wL}$, which may be between about 10 nm and about 20 nm, first dielectric spacer $spacer_1$ and second dielectric spacer $spacer_2$ each have a height $H_S$, which may be between about 5 nm and about 15 nm. Memory cell $M_X$ has a height substantially equal to height $H_{wL}$ of target word line $WL_T$. In an embodiment, first dielectric spacer $spacer_1$ and second dielectric spacer $spacer_2$ are both formed of the same dielectric material having a dielectric constant $\in$, which may be between about 3.9 and about 24, although other heights and dielectric constant values may be used.

In an example embodiment, word lines $WL_T$, $WL_{D1}$ and $WL_{D2}$ are titanium nitride and have a height $H_{wL}=10$ nm, first dielectric spacer $spacer_1$ and second dielectric spacer $spacer_2$ are each silicon nitride ($\in=8$) and each have a height $H_S=6$ nm, and bit line BL is a highly doped silicon (e.g., n+ polysilicon). Other materials, heights and dielectric constants may be used.

In an example FORMING operation of memory cell $M_X$, a first voltage V1 (e.g., +2V) is applied to target word line $WL_T$, a second voltage V2 (e.g., −3V) is applied to dummy word lines $WL_{D1}$ and $WL_{D2}$, and a third voltage V3 (e.g., 0V) is applied to bit line BL. Other voltages may be used. In addition, first voltage V1 may be a negative voltage and second voltage V2 may be a positive voltage. Voltages V1, V2 and V3 each may be DC voltages, although other signals (e.g., pulses) may be used. If pulse waveforms are used, the pulse widths of first voltage V1 and second voltage V2 may be the same, but different voltage polarities and magnitudes may be used.

The FORMING operation may be controlled by measuring a current $I_{WL}$ conducted by target word line $W_T$. For example, first voltage V1, second voltage V2 and third voltage V3 may be applied until $I_{WL} \geq Iform$, where Iform is a predetermined threshold forming current. For example, Iform may be between about 50 nA and about 200 nA, although other values may be used. Alternatively, first voltage V1, second voltage V2 and third voltage V3 may be applied for a predetermined time Tform, where Tform may be between about 100000 nsec and about 10000000 nsec, although other values may be used.

Without wanting to be bound by any particular theory, it is believed that by applying first voltage V1 to target word line $W_T$ while applying second voltage V2 having an opposite polarity to that of first voltage V1 to dummy word lines $WL_{D1}$ and $WL_{D2}$ may tune an electric field between target word line $W_T$ and bit line BL. In particular, it is believed that the electric field between target word line $W_T$ and bit line BL may be tuned to have a substantially maximum value towards a vertical center (depicted as center line 600) of memory cell $M_X$.

Without wanting to be bound by any particular theory, it is believed that conductive filament growth in reversible resistance-switching memory material RW is a function of the strength of the electric field between target word line $W_T$ and bit line BL, and that by substantially maximizing the electric filed strength towards vertical center 600 of memory cell $M_X$, conductive filaments 602 may be substantially confined to a filament region 604 having a height $H_F$ less than height $H_{WL}$ and disposed about vertical center 600 of memory cell $M_X$. Height $H_F$ of filament region 604 may be between about 3 nm and about 5 nm, although other heights may be used. In this regard, it is believed that filament confinement in reversible resistance-switching memory cells may be achieved electrically without physically reducing the size of word lines in the memory array, and without increasing a resistance of word lines in the memory array.

During the FORMING operation described above, a first voltage difference VD1=(V1−V3) is applied between target word line $W_T$ and bit line BL, a second voltage difference VD2=(V1−V2) is applied between target word line $W_T$ and the adjacent dummy word lines, and a third voltage difference VD3=(V2−V3) is applied between each of dummy word lines $WL_{D1}$ and $WL_{D2}$ and bit line BL. These voltage differences should meet the following parameters:

$|V1-V3| \geq VTH1$ $VTH2 \leq |V1-V2| < VTH3$ $|V2-V3| < VTH4$

That is, a magnitude of first voltage difference VD1 should be greater than or equal to a first threshold voltage VTH1, which is a voltage required to achieve conductive filament formation between target word line $W_T$ and bit line BL. In embodiments, first threshold voltage VTH1 may be between about 3V and about 8V, although other values may be used.

In addition, a magnitude of second voltage difference VD2 should be greater than a second voltage threshold VTH2, which is a voltage required to achieve filament confinement in memory cell $M_X$, and less than a third voltage threshold VTH3, which is a breakdown voltage of first dielectric spacer $spacer_1$ and second dielectric spacer $spacer_2$. In embodiments, second threshold voltage VTH2 may be between about 3V and about 5V, although other values may be used, and third threshold voltage VTH3 may be between about 7V and about 9V, although other values may be used.

Further, a magnitude of third voltage difference VD3 should be less than a fourth voltage threshold VTH4, which is a voltage required to achieve conductive filament formation between each of dummy word lines $WL_{D1}$ and $WL_{D2}$ and bit line BL. In other words, applying second voltage V2 to dummy word lines $WL_{D1}$ and $WL_{D2}$ should not result in conductive filament formation between dummy word lines $WL_{D1}$ and $WL_{D2}$ and bit line BL. In embodiments, fourth threshold voltage VTH4 may be between about 3V and about 5V, although other values may be used.

In addition, height $H_S$ and dielectric constant $\in$ of first dielectric spacer $spacer_1$ and second dielectric spacer $spacer_2$ should be selected to achieve sufficient coupling of electric fields from dummy word lines $WL_{D1}$ and $WL_{D2}$ to target word line $W_T$ to achieve filament confinement in memory cell $M_X$.

Values for each of first voltage V1, second voltage V2, third voltage V3, height $H_S$, dielectric constant $\in$, first threshold voltage VTH1, second threshold voltage VTH2, third threshold voltage VTH3 and fourth threshold voltage VTH4 may be determined using circuit simulation tools and/or empirical measurements, or by other techniques.

The filament confinement techniques described above in connection with FIG. 6 can be applied to a memory array that includes a stack of word lines, such as monolithic three-dimensional memory array 400a of FIG. 4B, with actual word lines used in place of dummy word lines.

Figure 7:
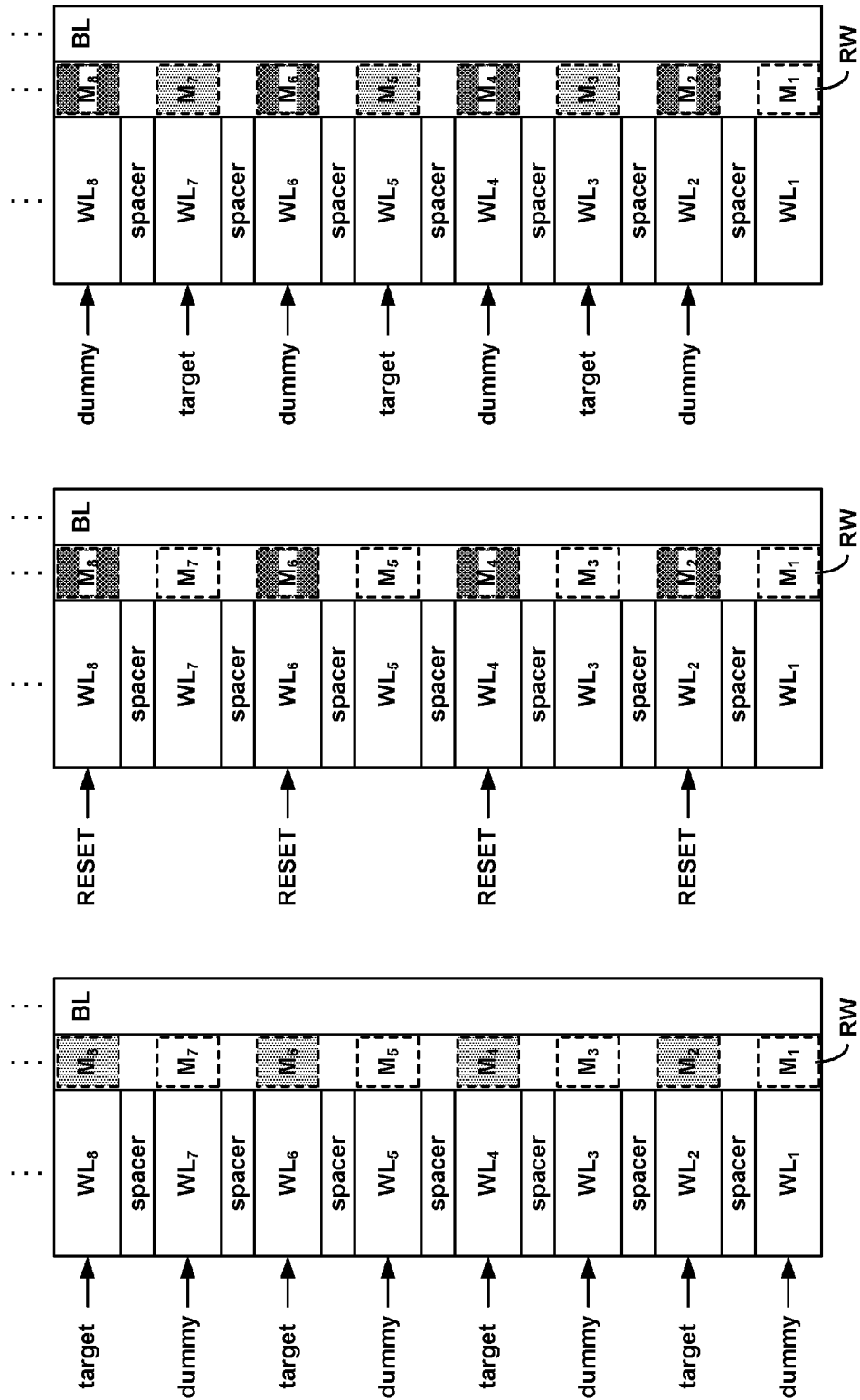
FIGS. 7A-7C depict side views of a portion of a memory array that includes reversible resistance-switching memory cells.

For example, FIGS. 7A-7C depict a side view of a portion of a memory array that includes a reversible resistance-switching memory material RW disposed between a stack of word lines $WL_1, WL_2, \ldots, WL_8 \ldots$ and vertical bit line BL. A dielectric spacer is disposed between adjacent word lines $WL_1, WL_2, \ldots, WL_8, \ldots$, Memory cells $M_1, M_2, \ldots, M_8, \ldots$ are disposed between vertical bit line BL and word lines $WL_1, WL_2, \ldots, WL_8, \ldots$ respectively.

Figure 8:
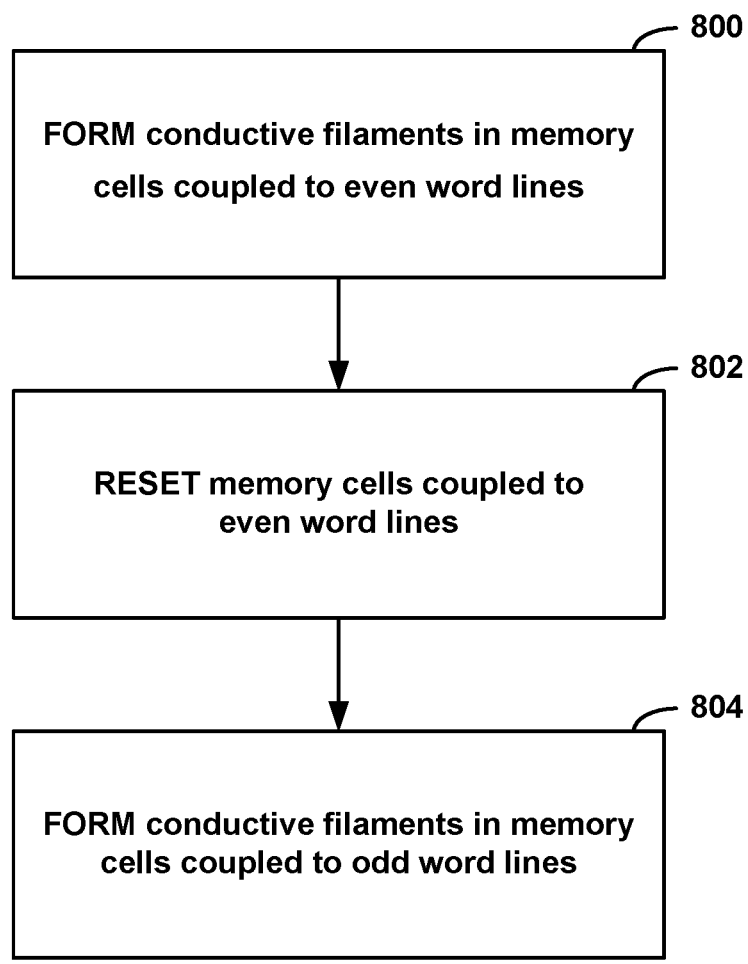
FIG. 8 is a flow chart describing an embodiment of a process for FORMING memory cells.

FIG. 8 is a flow chart describing an embodiment of a process for FORMING memory cells, such as memory cells $M_1, M_2, \ldots, M_8$ of FIGS. 7A-7C, using the filament confinement techniques described above. In an embodiment, the process of FIG. 8 may be performed by a memory system or by a memory controller, such as memory chip controller 104 of FIG. 1A and/or memory core control circuits 108 of FIG. 1B.

In step 800 of FIG. 8, conductive filaments are FORMED using filament confinement in memory cells coupled to even word lines. For example, referring to FIG. 7A, during a first forming step, word line $WL_2$ is a target word line, and word lines $WL_1$ and $WL_3$ are used as dummy word lines. First voltage V1 (e.g., +2V) is applied to target word line $WL_2$, second voltage V2 (e.g., −3V) is applied to dummy word lines $WL_1$ and $WL_3$, and third voltage V3 (e.g., 0V) is applied to bit line BL to form one or more conductive filaments in memory cell $M_2$. As described above, first voltage V1, second voltage V2 and third voltage V3 may be applied while monitoring current in target word line $WL_2$, and the forming operation may terminate when the monitored word line current exceeds predetermined current Iform (e.g., 100 nA). While FORMING memory cell $M_2$, word lines $WL_4$-$WL_8 \ldots$ may be floated.

During a second forming step, word line $WL_4$ is a target word line, and word lines $WL_3$ and $WL_5$ are used as dummy word lines. First voltage V1 is applied to target word line $WL_4$, second voltage V2 is applied to dummy word lines $WL_3$ and $WL_5$, and third voltage V3 is applied to bit line BL to form one or more conductive filaments in memory cell $M_4$. First voltage V1, second voltage V2 and third voltage V3 may be applied while monitoring current in target word line $WL_4$, and the forming operation may terminate when the monitored word line current exceeds predetermined current Iform. While FORMING memory cell $M_4$, word lines $WL_1$-$WL_2$ and $WL_6$-$WL_8$ . . . may be floated.

During a third forming step, word line $WL_6$ is a target word line, and word lines $WL_5$ and $WL_7$ are used as dummy word lines. First voltage V1 is applied to target word line $WL_6$, second voltage V2 is applied to dummy word lines $WL_5$ and $WL_7$, and third voltage V3 is applied to bit line BL to form one or more conductive filaments in memory cell $M_6$. First voltage V1, second voltage V2 and third voltage V3 may be applied while monitoring current in target word line $WL_6$, and the forming operation may terminate when the monitored word line current exceeds predetermined current Iform. While FORMING memory cell $M_6$, word lines $WL_1$-$WL_4$ and $WL_8$ . . . may be floated.

This process continues until all memory cells coupled to even word lines are FORMED. At the end of step 800 of FIG. 8, memory cells $M_2$, $M_4$, $M_6$, $M_8$, . . . coupled to even word lines $WL_2$, $WL_4$, $WL_6$, $WL_8$, . . . are in a LOW resistance state (indicated by light shading in FIG. 7A).

Referring again to FIG. 8, at step 802, memory cells coupled to even word lines are RESET from the LOW resistance state to a HIGH resistance state. For example, referring to FIG. 7B, RESET signals are applied to even word lines $WL_2$, $WL_4$, $WL_6$, $WL_8$, . . . to RESET memory cells $M_2$, $M_4$, $M_6$, $M_8$, . . . , respectively. At the end of step 802 of FIG. 8, memory cells $M_2$, $M_4$, $M_6$, $M_8$, . . . coupled to even word lines $WL_2$, $WL_4$, $WL_6$, $WL_8$, . . . are in a HIGH resistance state (indicated by dark shading in FIG. 7B).

Referring again to FIG. 8, at step 804, conductive filaments are FORMED using filament confinement in memory cells coupled to odd word lines. For example, referring to FIG. 7C, during a first forming step, word line $WL_3$ is a target word line, and word lines $WL_2$ and $WL_4$ are used as dummy word lines. First voltage V1 is applied to target word line $WL_3$, second voltage V2 is applied to dummy word lines $WL_2$ and $WL_4$, and third voltage V3 is applied to bit line BL to form one or more conductive filaments in memory cell $M_3$. First voltage V1, second voltage V2 and third voltage V3 may be applied while monitoring current in target word line $WL_3$, and the forming operation may terminate when the monitored word line current exceeds predetermined current Iform. While FORMING memory cell $M_3$, word lines $WL_1$ and $WL_5$-$WL_8$ . . . may be floated.

During a second forming step, word line $WL_5$ is a target word line, and word lines $WL_4$ and $WL_6$ are used as dummy word lines. First voltage V1 is applied to target word line $WL_5$, second voltage V2 is applied to dummy word lines $WL_4$ and $WL_6$, and third voltage V3 is applied to bit line BL to form one or more conductive filaments in memory cell $M_5$. First voltage V1, second voltage V2 and third voltage V3 may be applied while monitoring current in target word line $WL_5$, and the forming operation may terminate when the monitored word line current exceeds predetermined current Iform. While FORMING memory cell $M_5$, word lines $WL_1$-$WL_3$ and $WL_7$-$WL_8$ . . . may be floated.

During a third forming step, word line $WL_7$ is a target word line, and word lines $WL_6$ and $WL_8$ are used as dummy word lines. First voltage V1 is applied to target word line $WL_7$, second voltage V2 is applied to dummy word lines $WL_6$ and $WL_8$, and third voltage V3 is applied to bit line BL to form one or more conductive filaments in memory cell $M_7$. First voltage V1, second voltage V2 and third voltage V3 may be applied while monitoring current in target word line $WL_7$, and the forming operation may terminate when the monitored word line current exceeds predetermined current Iform. While FORMING memory cell $M_7$, word lines $WL_1$-$WL_5$ and $WL_9$ . . . may be floated.

This process continues until all memory cells coupled to odd word lines are FORMED. At the end of step 804 of FIG. 8, memory cells $M_3$, $M_5$, $M_7$, . . . coupled to odd word lines $WL_3$, $WL_5$, $WL_7$, . . . are in a LOW resistance state (indicated by light shading in FIG. 7C).

Thus, as described above, one embodiment of the disclosed technology includes a method that includes providing a memory device including a first word line, a vertical bit line, a non-volatile memory material disposed between the first word line and the vertical bit line, and a memory cell disposed between the first word line and the vertical bit line. The first word line has a first height. The method further includes forming one or more conductive filaments in the memory cell. The one or more conductive filaments are substantially confined to a filament region having a second height less than the first height and disposed substantially about a vertical center of the memory cell.

One embodiment of the disclosed technology includes a method that includes providing a memory array including a plurality of word lines, a dielectric spacer disposed between adjacent word lines, a vertical bit line, a non-volatile memory material disposed between the plurality of word lines and the vertical bit line, and a plurality of memory cells disposed between a corresponding one of the plurality of word lines and the vertical bit line, each of the plurality of word lines having a first height. The method further includes forming one or more conductive filaments in each of the plurality of memory cells, wherein the one or more conductive filaments in each of the plurality of memory cells are substantially confined to a corresponding filament region having a second height less than the first height and disposed substantially about a vertical center in each of the plurality of memory cells.

One embodiment of the disclosed technology includes an apparatus including a memory device and a controller. The memory device includes a first word line, a vertical bit line, a non-volatile memory material disposed between the first word line and the vertical bit line, and a memory cell disposed between the first word line and the vertical bit line, the first word line having a first height. The controller is configured to form one or more conductive filaments in the memory cell, wherein the one or more conductive filaments are substantially confined to a filament region having a second height less than the first height and disposed substantially about a vertical center of the memory cell.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method comprising:
   providing a memory device comprising a first word line, a second word line, a third word line, a first dielectric spacer disposed between the first word line and the second word line, and a second dielectric spacer disposed between the first word line and the third word line, a vertical bit line, a non-volatile memory material disposed between the first word line and the vertical bit line, and a memory cell disposed between the first word line and the vertical bit line, the first word line having a first height, and the non-volatile memory material comprising a uniform thickness between the first word line and the vertical bit line;
   forming one or more conductive filaments in the memory cell by applying a first voltage to the first word line, a second voltage to the second and third word lines, and a third voltage to the vertical bit line, wherein the second voltage has a polarity opposite the first voltage, wherein the one or more conductive filaments are substantially confined to a filament region having a second height less than the first height and disposed substantially about a vertical center of the memory cell; and
   forming an electric field between the first word line and the vertical bit line, wherein the second voltage tunes the electric field to have a substantially maximum value towards the vertical center of the memory cell.

2. The method of claim 1, further comprising electrically confining the one or more conductive filaments substantially in the filament region.

3. The method of claim 1, wherein the non-volatile memory material comprises a reversible resistance-switching memory material.

4. The method of claim 1, wherein the non-volatile memory material comprises a metal oxide material or a phase change material.

5. An apparatus comprising:
   a memory device comprising a first word line, a second word line, a third word line, a first dielectric spacer disposed between the first word line and the second word line, and a second dielectric spacer disposed between the first word line and the third word line, a vertical bit line, a non-volatile memory material disposed between the first word line and the vertical bit line, and a memory cell disposed between the first word line and the vertical bit line, the first word line having a first height, and the non-volatile memory material comprising a uniform thickness between the first word line and the vertical bit line; and
   a controller configured to:
      form one or more conductive filaments in the memory cell by applying a first voltage to the first word line, a second voltage to the second and third word lines, and a third voltage to the vertical bit line, wherein the second voltage has a polarity opposite the first voltage, wherein the one or more conductive filaments are substantially confined to a filament region having a second height less than the first height and disposed substantially about a vertical center of the memory cell; and
      form an electric field between the first word line and the vertical bit line, wherein the second voltage tunes the electric field to have a substantially maximum value towards the vertical center of the memory cell.

6. The apparatus of claim 5, wherein the controller is further configured to electrically confine the one or more conductive filaments substantially in the filament region.

7. The apparatus of claim 5, wherein the non-volatile memory material comprises a reversible resistance-switching memory material.

8. The apparatus of claim 5, wherein the non-volatile memory material comprises a metal oxide material or a phase change material.

* * * * *